United States Patent [19]
Ishibashi

[11] 4,400,682
[45] Aug. 23, 1983

[54] PRESSURE SENSOR

[75] Inventor: Kiyoshi Ishibashi, Itami, Japan

[73] Assignee: Mitsubishi Denki Kabushiki Kaisha, Toyko, Japan

[21] Appl. No.: 319,060

[22] Filed: Nov. 6, 1981

[30] Foreign Application Priority Data

Nov. 10, 1980 [JP] Japan .............................. 55/159071

[51] Int. Cl.³ .............................................. G01L 1/22
[52] U.S. Cl. ........................................ 338/4; 338/42
[58] Field of Search ........................................ 338/2–5, 338/7, 42; 73/727, 726, 721, 720, 708, DIG. 4; 357/26; 29/610 SG

[56] References Cited

U.S. PATENT DOCUMENTS

| | | | |
|---|---|---|---|
| 3,079,576 | 2/1963 | Kooiman | 338/4 |
| 4,040,297 | 8/1977 | Karsmakers et al. | 338/4 X |
| 4,222,277 | 9/1980 | Kurtz et al. | 73/727 X |
| 4,314,225 | 2/1982 | Tominaga et al. | 73/727 X |
| 4,373,397 | 2/1983 | Keller | 73/727 X |

Primary Examiner—C. L. Albritton
Attorney, Agent, or Firm—Oblon, Fisher, Spivak, McClelland & Maier

[57] ABSTRACT

A pressure sensor comprises: a pressure sensor chip including a diaphragm, a stationary support supporting said diaphragm, and a bed supporting said stationary support, said diaphragm, said stationary support and said bed being made of a semiconductor material and defining a space which is evacuated; a holding box having at least its bottom made of metal and having a hole for internal wiring, said holding box accommodating and holding said pressure sensor chip such that the opposite side to the diaphragm of said pressure sensor chip is in contact with the inner side of said bottom and that said pressure sensor chip is restricted from movement; and a package placing and adhering said holding box in position.

2 Claims, 4 Drawing Figures

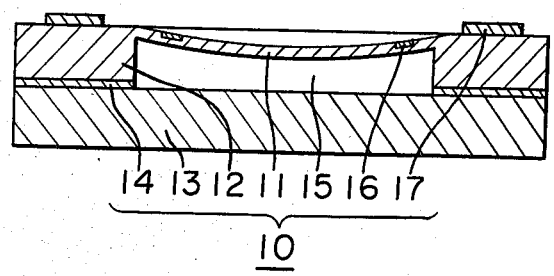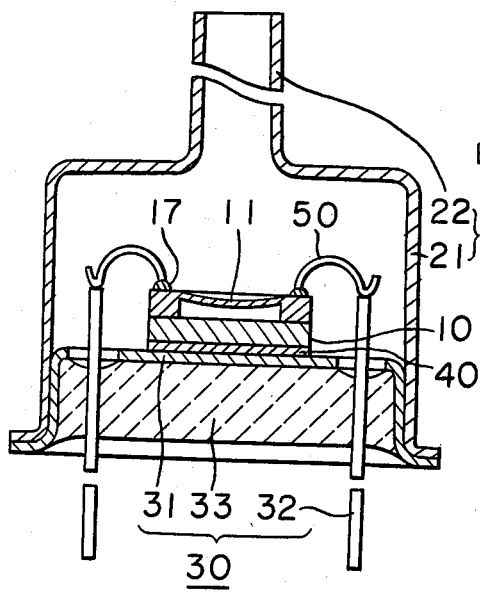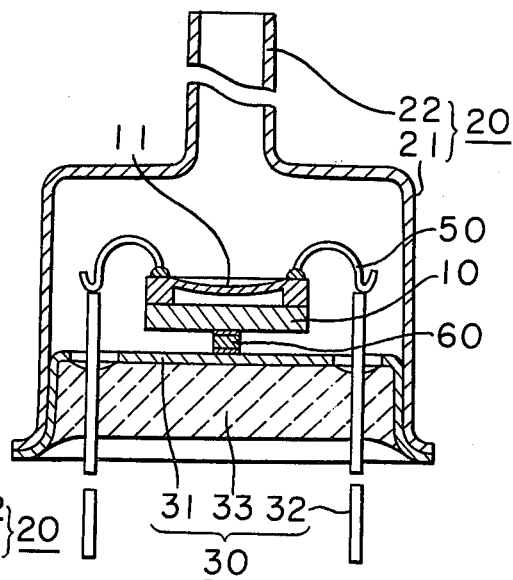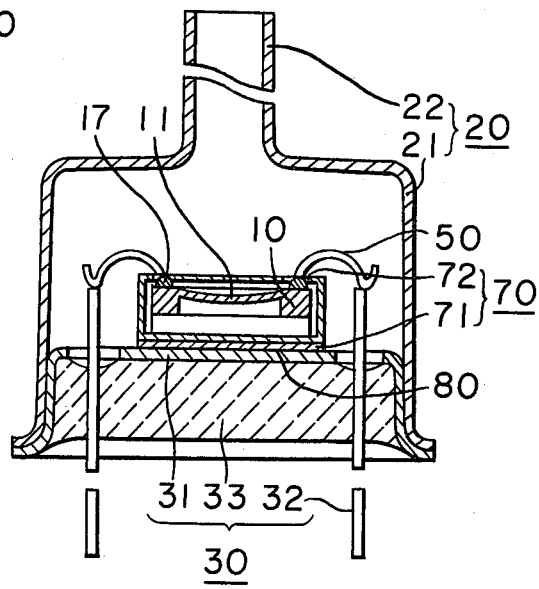

PRESSURE SENSOR

BACKGROUND OF THE INVENTION

1. Field of the Invention

The present invention relates to a pressure sensor for detecting a pressure level with the use of semiconductor strain gauge.

2. Description of the Prior Art

According to the basic principle of the pressure sensor, an impurity is diffused into a single crystal of semiconductor such as silicon to prepare a gauge resistor so that the change in the resistance of the gauge resistor as a result of the piezoelectric effect due to a strain is converted into an electric signal and is measured.

The pressure sensor is roughly divided into two type, i.e., the absolute pressure type and the differential pressure type in respect to its function. The pressure sensor according to the present invention is a kind of the so-called "absolute pressure type", in which an external pressure is detected with reference to the vacuum established in such a space as is defined by adhering a stationary support supporting a silicon diaphragm and a silicon bed, whereby the absolute pressure can be measured.

FIG. 1 is a sectional view showing a pressure sensor chip to be used in a pressure sensor of the absolute pressure type. In FIG. 1: numeral 11 indicates a diaphragm made of silicon; 12 a stationary support supporting the diaphragm 11; 13 a bed made of silicon; 14 a brazing material adhering the stationary support 12 and the bed 13; 15 an evacuated space which is defined by the diaphragm 11, the stationary support 12 and the bed 13; 16 a gauge resistor which is formed in the surface of the diaphragm 11 by the impurity diffusion process; and 17 resistors which are formed on the stationary support 12. These components thus far described constitute a pressure sensor chip 10. The diaphragm 11 is warped toward the bed 13 by the external pressure.

FIG. 2 is a sectional view showing the pressure sensor of the absolute pressure type according to the prior art, in which the pressure sensor chip is directly adhered to a package. In FIG. 2: numeral 10 indicates the pressure sensor chip; 20 the cap of a package; 21 the cap body of the cap 20; 22 an external pressure introduction pipe of the cap 20; 30 a stem; 31 the metal frame of the stem 30; 32 the external leads of the stem 30; 33 the insulator of the stem 30; 40 the brazing material adhering the pressure sensor chip 10 to the metal frame 31 of the stem 30; and 50 internal wirings such as thin gold wires connecting the electrodes 17 of the pressure sensor chip 10 and the external leads 32. The cap 20 and the stem 30 constitute together the package.

If the pressure sensor chip 10 is directly attached by means of the brazing material 40 or an adhesive to the package stem 30, as in the above, a strain is applied to the diaphragm 11 as a result of the difference in thermal expansion between silicon and the material of the package. The stress resulting from that strain is detected by the pressure sensor itself, and the correction of the detected value has been required for practical uses. Nevertheless, it has been difficult to accurately control the stress resulting from the strain, and the correction has been possible for experimental purposes but hardly impossible for mass-production.

FIG. 3 is a sectional view showing a conventional pressure sensor which has been conceived to reduce the thermal strain resulting from the difference in thermal expansion. In FIG. 3, reference numerals similar to those appearing in FIG. 2 indicate parts similar to those of FIG. 2. Numeral 60 indicates a silicon support having an adhesion area of 1 to 4 mm$^2$, which is attached to the opposite side of the pressure sensor chip 10 to the diaphragm 11 and which is adhered to the metal frame 31 of the stem 30 by means of an eutectic brazing material of Au-Si, for example. The pressure sensor shown in FIG. 3 is so devised that the thermal strain due to adhesion between different materials may hardly be transmitted to the pressure sensor chip 10 by sandwiching the silicon support 60 having the small adhesion area between the pressure sensor chip 10 and the stem 30. However, this device has not succeeded in settling the subject matter drastically, but there has been no way of avoiding that more or less thermal strain is transmitted to the diaphragm 11.

It is obvious that the thermal strain resulting from the adhesion between the package and the bed can be solved by completely floating the pressure sensor chip over the package. The reason why that simple fact has never been put into practice is to make remarkably difficult the subsequent wire bonding of the internal wirings. Even if the wire bonding could be performed, the support of the pressure sensor chip exclusively by the internal wirings would invite a danger that the pressure sensor chip is shifted to break the internal wirings, as has been accepted in the art, thus raising a practical problem.

SUMMARY OF THE INVENTION

The present invention has been conceived in view of the background thus far described, and has an object to provide a pressure sensor which is devised to prevent the thermal strain due to the adhesion between different materials from being transmitted to the diaphragm of a pressure sensor chip by holding the pressure sensor chip in contact with the inner side of the metal bottom of a holding box for restricting the movement thereof and by adhering the outer side of the bottom of that holding box to a package.

In accordance with the present invention, a pressure sensor comprising: a pressure sensor chip including a diaphragm, a stationary support supporting said diaphragm, and a bed supporting said stationary support, said diaphragm, said stationary support and said bed being made of a semiconductor material and defining a space which is evacuated; a holding box having at least its bottom made of metal and having a hole for internal wiring, said holding box accomodating and holding said pressure sensor chip such that the opposite side to the diaphragm of said pressure sensor chip is in contact with the inner side of said bottom and that said pressure sensor chip is restricted from movement; and a package placing and adhering said holding box in position.

BRIEF DESCRIPTION OF THE DRAWINGS

FIG. 1 is a sectional view showing the pressure sensor chip;

FIGS. 2 and 3 are sectional views showing examples of the pressure sensor according to the prior art, respectively; and FIG. 4 is a sectional view showing the one embodiment of the pressure sensor according to the present invention.

DETAILED DESCRIPTION OF THE PREFERRED EMBODIMENTS

The present invention will now be described in connection with the embodiment thereof.

FIG. 4 is a sectional view showing one embodiment of the pressure sensor according to the present invention. In FIG. 4, reference numerals similar to those appearing in FIG. 2 indicate parts similar to those of FIG. 2. Numeral 70 indicates a holding box which has at least its bottom made of metal and which accommodates and holds the pressure sensor chip 10 such that the opposite side of the sensor chip 10 to the diaphragm 11 is held in contact with the inner side of the bottom thereof and that the pressure sensor chip 10 is restricted from any movement. Numeral 71 indicates that bottom of the holding box 70. Numeral 72 indicates holes which are formed in the top of the holding box 70 so as to guide the electrodes 17 of the pressure sensor chip 10 out of the holding box 70. Numeral 80 indicates a brazing material which adheres the bottom 71 of the holding box 70 to the metal frame 31 of the stem 30 of the package.

In the pressure sensor thus far described according to the embodiment, the holding box 70 is brazed to the metal frame 31 of the stem 30. Nevertheless, since the pressure sensor chip 10 is placed upon and in contact with the inner side of the bottom of the holding box 70 but is not adhered thereto so that it can slide thereon, the thermal strain resulting from the difference in thermal expansion between the metal materials of the metal frame 31 of the stem 30 and the holding box 70 is prevented from being transmitted to the pressure sensor chip 10. As a result, the diaphragm 11 is never influenced by that thermal strain. Moreover, since the pressure sensor chip 10 is accommodated and held in the holding box 70 such that it is restricted from any movement, the wire bonding of the internal wirings 50 to the electrodes 17 of the pressure sensor chip 10 is facilitated, and the internal wirings 50 themselves can be prevented from being broken by the movement of the pressure sensor chip 10.

In the embodiment thus far described, the electrodes 17 of the pressure sensor chip 10 lead through the holes 72 of the holding box 70 to the outside of this box 70. However, it is not always necessary for the electrodes 17 to extend out of the holding box 70 if the holes 72 are enlarged.

Moreover, the embodiment thus far described is directed to the case, in which the diaphragm 11, the stationary support 12 and the bed 13 of the pressure sensor chip 10 are made of silicon. Nevertheless, they may be made of another suitable semiconductor material.

In the pressure sensor according to the present invention, as has been described in detail hereinbefore, since the pressure sensor chip is placed upon and in contact with the inner side of the metal bottom of the holding box for accommodating and holding that pressure sensor chip in a movement-restricted manner and since the outer side of the bottom of that holding box is adhered to the package, the thermal strain resulting from the adhesion between the different materials can be prevented from being transmitted to the diaphragm of the pressure sensor chip.

Still moreover, since the movement of the pressure sensor chip is restricted, the wire bonding of the internal wirings to the pressure sensor chip can be facilitated, and the internal wirings can be prevented from being broken by the movement of the pressure sensor chip.

I claim:

1. A pressure sensor comprising: a pressure sensor chip including a diaphragm, a stationary support supporting said diaphragm, and a bed supporting said stationary support, said diaphragm, said stationary support and said bed being made of a semiconductor material and defining a space which is evacuated; a holding box having at least its bottom made of metal and having a hole for internal wiring, said holding box accommodating and holding said pressure sensor chip such that the opposite side to the diaphragm of said pressure sensor chip is in contact with the inner side of said bottom and that said pressure sensor chip is restricted from movement; and a package placing and adhering said holding box in position.

2. A pressure sensor as set forth in claim 1, wherein said semiconductor material is silicon.

* * * * *